US007936019B2

(12) United States Patent
Raffaelle et al.

(10) Patent No.: US 7,936,019 B2

(45) Date of Patent: May 3, 2011

(54) NANO AND MEMS POWER SOURCES AND METHODS THEREOF

(75) Inventors: Ryne P. Raffaelle, Honeoye Falls, NY (US); David Wilt, Bay Village, OH (US)

(73) Assignees: Rochester Institute of Technology, Rochester, NY (US); Glenn Research Center, Cleveland, OH (US)

( * ) Notice: Subject to any disclaimer, the term of this patent is extended or adjusted under 35 U.S.C. 154(b) by 113 days.

(21) Appl. No.: 11/180,841

(22) Filed: Jul. 13, 2005

(65) Prior Publication Data

US 2006/0017108 A1 Jan. 26, 2006

Related U.S. Application Data

(60) Provisional application No. 60/587,364, filed on Jul. 13, 2004.

(51) Int. Cl.
*H01L 29/66* (2006.01)

(52) U.S. Cl. . 257/353; 257/288; 257/367; 257/E27.124; 438/22; 438/39

(58) Field of Classification Search .................. 136/202; 438/22, 39; 257/353, 288, 367, E27.124–E27.126
See application file for complete search history.

(56) References Cited

U.S. PATENT DOCUMENTS

| | | | | |
|---|---|---|---|---|
| 4,178,524 | A | 12/1979 | Ritter | |
| 5,132,763 | A * | 7/1992 | Maserjian | 257/21 |
| 5,260,621 | A | 11/1993 | Little et al. | |
| 5,440,187 | A | 8/1995 | Little et al. | |
| 5,590,162 | A | 12/1996 | Terhune et al. | |
| 5,595,607 | A * | 1/1997 | Wenham et al. | 136/244 |
| 5,642,014 | A | 6/1997 | Hillenius | |
| 5,859,484 | A | 1/1999 | Mannil et al. | |
| 6,329,587 | B1 * | 12/2001 | Shoga | 136/202 |
| 6,841,411 | B1 * | 1/2005 | Varghese | 438/94 |
| 6,949,865 | B2 * | 9/2005 | Gadeken | 310/303 |

OTHER PUBLICATIONS

Pfann & Van Roosbroeck, "Radioactive and Photoelectric *p-n* Junction Power Sources," *Journal of Applied Physics* 25(11):1422-1434 (1954).

Rybicki, "Silicon Carbide Alphavoltaic Battery," *Proceedings of the 25th IEEE Photovoltaic Specialists Conference* pp. 93-96 (1996).

* cited by examiner

*Primary Examiner* — Hoai V Pham
*Assistant Examiner* — Elias Ullah
(74) *Attorney, Agent, or Firm* — LeClairRyan

(57) ABSTRACT

A power source and methods thereof includes a structure comprising one or more p type layers, one or more n type layers, and one or more intrinsic layers and at least one source of radiation is disposed on at least a portion of the structure. Each of the p type layers is separated from each of the n type layers by one of the intrinsic layers.

21 Claims, 2 Drawing Sheets

NANO AND MEMS POWER SOURCES AND METHODS THEREOF

This application claims the benefit of U.S. Provisional Patent Application Ser. No. 60/587,364 filed Jul. 13, 2004, which is herein incorporated by reference in its entirety.

This invention was developed with government funding under NSA Grant No. NAG3-2595. The U.S. Government may have certain rights.

FIELD OF THE INVENTION

The present invention generally relates to batteries and, more particularly, to radio isotope batteries and methods thereof.

BACKGROUND

The concept of an alpha voltaic battery was proposed in 1954 as disclosed in W. G. Pfann and W. van Roosbroeck, Journal of Applied Physics, Volume 25, No. 11, pp. 1422-1434, November 1954, which is herein incorporated by reference. A radioactive substance that emits energetic alpha particles is coupled to a semiconductor p/n junction diode. As the alpha particles penetrate into the p/n junction, they decelerate and give up their energy as electron-hole pairs. These electron-hole pairs are collected by the p/n junction and converted into useful electricity, much like a solar cell.

The main reason alpha-voltaics and also beta-voltaics are not commercially successful is that the alpha or beta particles damage the semiconductor material as disclosed in G. C. Rybicki, C. V. Aburto, R. Uribe, Proceedings of the 25$^{th}$ IEEE Photovoltaic Specialists Conference, pp. 93-96, 1996, which is herein incorporated by reference. More specifically, the pn-junction in the alpha or beta voltaic device, which converts the alpha or beta particle radiation, respectively, from the radioactive isotope into electricity, rapidly degrades due to radiation damage rendering the alpha or beta voltaic device useless long before the radioisotope is depleted.

SUMMARY

A power source in accordance with embodiments of the present invention comprises a structure comprising one or more p type layers, one or more n type layers, and one or more intrinsic layers and at least one source of radiation is disposed on at least a portion of the structure. Each of the p type layers is separated from each of the n type layers by one of the intrinsic layers.

A method of making a power source in accordance with embodiments of the present invention includes depositing an intrinsic layer on one of an n type layer and a p type layer, depositing the other one of the n type layer and the p type layer on the deposited intrinsic layer, and disposing at least one source of radiation on at least the deposited one of the n type layer and the p type layer.

A method of generating power in accordance with embodiments of the present invention includes emitting radiation into a structure comprising one or more p type layers, one or more n type layers, and one or more intrinsic layers and converting the emitted radiation in the structure to power. In the structure each of the p type layers is separated from each of the n type layers by one of the intrinsic layers.

The present invention provides a radio isotope battery whose performance does not degrade in a matter of hours because of damage to the semiconductor material from the alpha or beta particles. The degradation is prevented in the present invention by using a structure comprising one or more p type layers, one or more n type layers, and one or more intrinsic layers, where each of the p type layers is separated from each of the n type layers by one of the intrinsic layers. The intrinsic layers prevent alpha or beta particles from the alpha or beta particle emitter from damaging the p type layers and the n type layers while successfully converting energy from the alpha or beta particles into electron-hole pairs for collection.

Another advantage of the present invention is that the radio isotope battery can be made extremely small and thus is well suited for emerging micro and nano applications and technologies, such as micro electrical mechanical systems (MEMS). The radio isotope battery can produce power on the order of micro-Watts, sufficient for many MEMS applications. Additionally, the radio isotope battery is very suitable for integration directly on a semiconductor device for a "battery-on-a-chip" concept. At this time, small long lived power sources simply do not exist for these types of applications and systems.

Yet another advantage of the present invention is that the radio isotope battery can be combined in parallel and series combinations to address a wide variety of higher current, voltage, and power requirements. For example, the present invention can be scaled to higher power levels on the order of hundreds of watts making it suitable for a variety of other applications, such as deep space missions. The radio isotope battery has two unique properties when compared to a conventional chemical battery that make it an outstanding candidate for deep space missions. First, the alpha or beta emitting materials have half-lives ranging from months to hundreds of years, so there is the potential for an almost "everlasting" batteries. Second, radio isotope batteries can operate over a tremendous temperature range, while an ordinary chemical batteries all fail at temperatures below −40° C.

DETAILED DESCRIPTION

Figure 1:
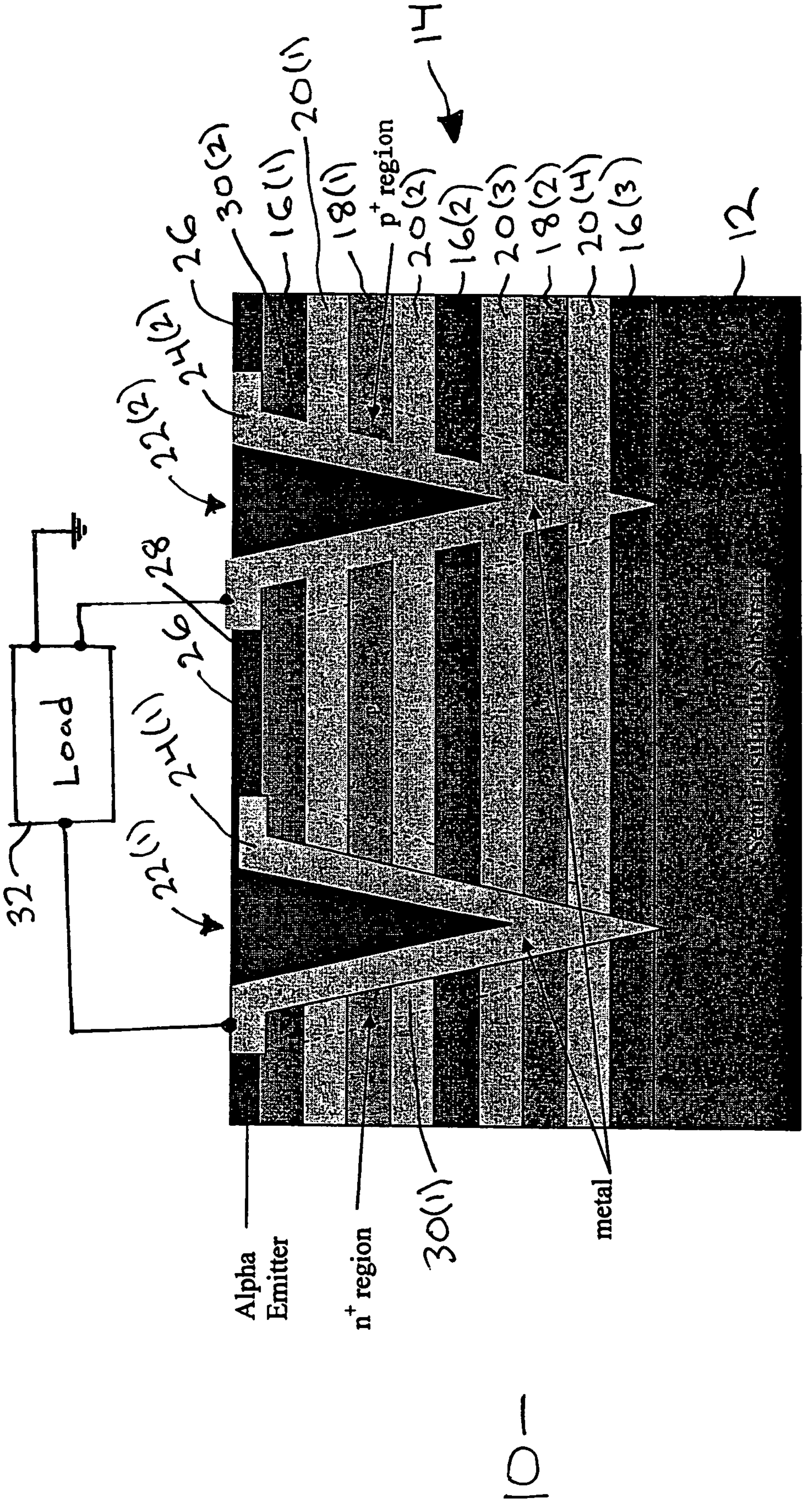
FIG. 1 is a schematic diagram of a radio isotope battery in accordance with embodiments of the present invention.

A battery 10 in accordance with embodiments of the present invention is illustrated in FIG. 1. The battery 10 includes a substrate 12, a semiconductor structure 14 with n type layers "n" or 16(1)-16(3), p type layers "p" or 18(1)-18(2), and intrinsic layers "i" or 20(1)-20(4), a pair of openings or holes 22(1)-22(2), a pair of conductive contacts 24(1)-24(2), and an alpha particle emitter 26, although the battery 10 can comprise other numbers and types of components, such as a beta particle or other radio isotope emitter, in other configurations. The present invention provides a number of advantages including providing a radio isotope battery 10 whose performance does not degrade in a matter of hours because of damage to the semiconductor material from the emitted alpha or beta particles.

Referring to FIG. 1, the structure 14 is formed on the substrate 12 which is made of an amorphous silicon, although the substrate 12 can be made of other types of semi-insulating and insulating materials.

The structure 14 is formed on the substrate 12 and comprises the n type layers 16(1)-16(3), p type layers 18(1)-18(2), and intrinsic layers 20(1)-20(4), where each of the p type layers 18(1)-18(2) is separated from each of the n type layers 16(1)-16(3) by one of the intrinsic layers 20(1)-20(4), although the structure 14 can comprise other numbers and types of layers in other configurations. By way of example only, semiconductor materials which could be used for the n type layers 16(1)-16(3), p type layers 18(1)-18(2), and intrinsic layers 20(1)-20(4) include GaAs, GaInP, SiC, Si, or other III-V, II-VI or group IV semiconductors, although other types of materials can be used. In this example, the semiconducting materials are grown epitaxially on single crystal wafers, such as GaAs.

Figure 2:
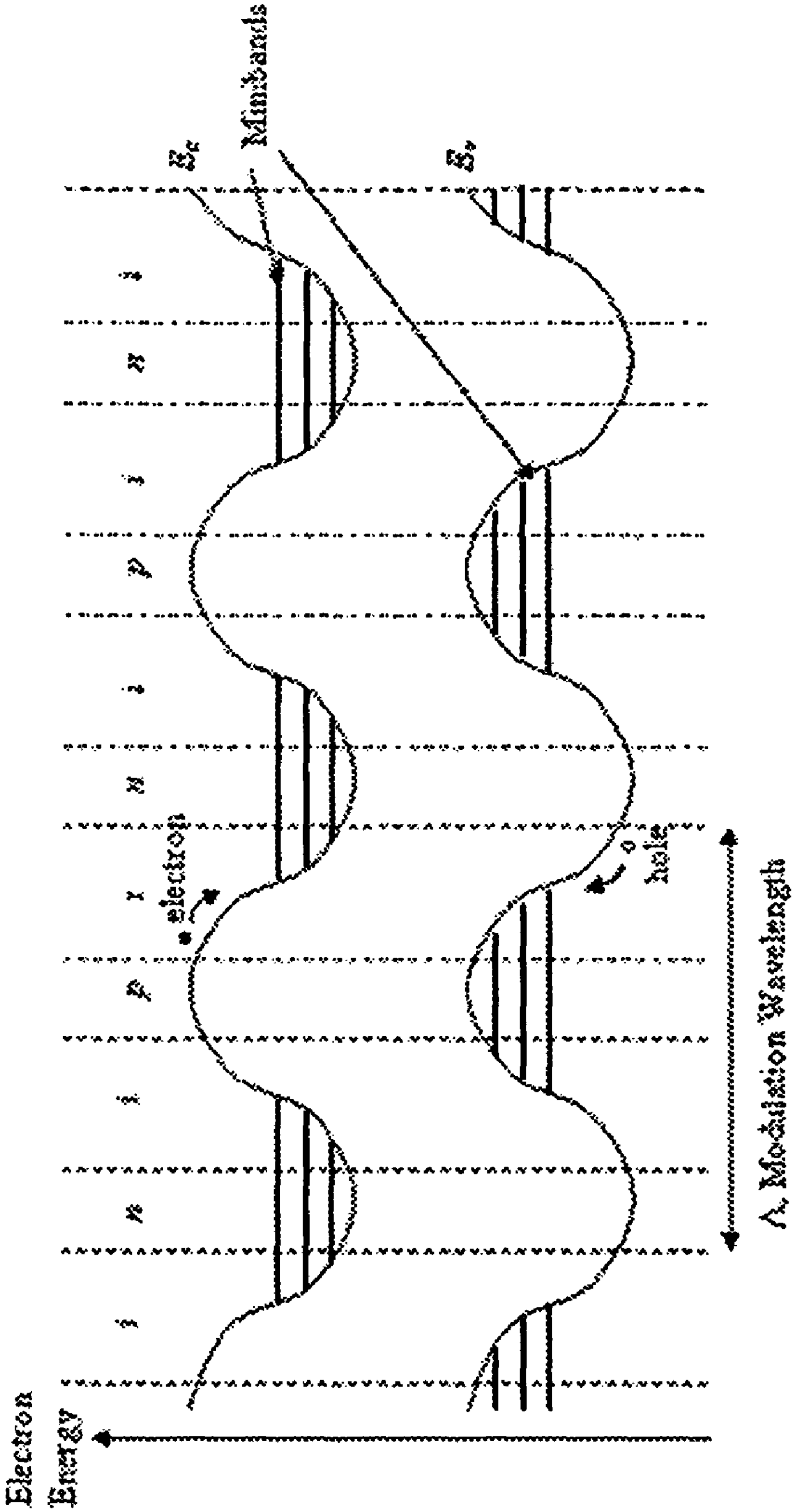
FIG. 2 is a diagram of real-space energy of an n-i-p-i crystal.

This structure 14 is used to convert the alpha radiation from the alpha particle emitter 26 into usable electricity, although the structure could convert other types of radio isotopes into energy, such as beta particles. This configuration of the structure 14 with each of the p type layers 18(1)-18(2) separated from each of the n type layers 16(1)-16(3) by one of the intrinsic layers 20(1)-20(4) also substantially prevents electrical degradation of the battery 10 by minimizing the effects alpha particle damage, although the configuration of the structure 14 can also protect from damage from other types of radio isotopes, such as beta particles. In this particular embodiment, each of the intrinsic layers 20(1)-20(4) has thickness of about 5000 angstrom which protects the n type layers 16(1)-16(3) and the p type layers 18(1)-18(2) from degradation, although each of the intrinsic layers 20(1)-20(4) could have other thicknesses which are sufficient to prevent substantial degradation while allowing conversion of the collected electron-hole pairs into useful electricity. By way of example only, a diagram of the real-space energy of another structure with this alternating configuration of an n type layer, an intrinsic layer, a p type layer, and an intrinsic layer, i.e. an "n-i-p-i" configuration or crystal, in accordance with other embodiments of the present invention is illustrated in FIG. 2.

Referring back to FIG. 1, each of the holes 22(1) and 22(2) has a cone-shape and extends in from a surface 28 of the n type layer 16(1) of the structure 14 through all of the n type layers 16(1)-16(3), p type layers 18(1)-18(2), and intrinsic layers 20(1)-20(4) to the substrate 12, although other numbers, shapes and configurations can be used for the holes 22(1) and 22(2) and the holes 22(1) and 22(2) can extend through other numbers of layers in the structure 14.

A region 30(1) adjacent an inner surface of the hole 22(1) shown by the dashed lines in FIG. 1 is doped to form an n+ region and a region 30(2) adjacent an inner surface of the other hole 22(2) also shown by the dashed lines in FIG. 1 is doped to form a p+ region, although the regions 30(1) and 30(2) around the inner surface of each of the holes 22(1) and 22(2) can have other configurations and can be doped in different manners.

The conductive contact 24(1) is located on the inner surface of the hole 22(1) adjacent the n+ region 30(1) and extends out from the hole 22(1) on to a portion of the surface 28 of the n type layer 16(1), although the conductive contact 24(1) can be formed in other manners and in other configurations. Similarly, the conductive contact 24(2) is located on the inner surface of the hole 22(2) adjacent the p+ region 30(2) and extends out from the hole 22(2) on to a portion of the surface 28 of the n type layer 16(1), although the conductive contact 24(2) also can be formed in other manners and in other configurations. In this example, ordinary metallization is used for each of the conductive contacts 24(1) and 24(2), although other types of conductive materials can be used. A load 32 can coupled across the conductive contacts 24(1) and 24(2) and to ground to store or use the generated electricity, although the load 32 can be coupled in other manners.

The alpha particle emitter 26 is electrochemically deposited on a portion of the n type layer 16(1) of the structure 14 and on an inside surface of the conductive contacts 24(1) and 24(2) in the holes 22(1) and 22(2), although the alpha particle emitter 26 can be deposited or placed in other manners and configurations and other types of radio isotope emitters can be used, such as a beta particle emitter. In this particular embodiment, the alpha particle emitter 26 is Am-241 thermally diffused in silver foil and over-coated with a thin metal layer, which is the same materials found in household smoke detectors, although other types of radiation sources could be used.

A method of making a battery in accordance with embodiments of the present invention will be described with reference to FIG. 1. The substrate 12 is made of an amorphous silicon is provided, although other types of substrates can be used. In this particular embodiment: the n type layer 16(3) is deposited on a surface of the substrate 12; the intrinsic layer 20(4) is deposited on a surface of the n type layer 16(3); the p type layer 18(2) is deposited on a surface of the intrinsic layer 20(4); the intrinsic layer 20(3) is deposited on a surface of the p type layer 18(2); the n type layer 16(2) is deposited on a surface of the intrinsic layer 20(3); the intrinsic layer 20(2) is deposited on a surface of the n type layer 16(2); the p type layer 18(1) is deposited on a surface of a surface of the intrinsic layer 20(2); the intrinsic layer 20(1) is deposited on a surface of the p type layer 18(1); and the n type layer 16(1) is deposited on a surface of the intrinsic layer 20(1) to form the structure 14, although the structure 14 can comprise other numbers and types of layers in other configurations. By way of example only, in this particular embodiment the n type layers 16(1)-16(3) are each about 500 angstroms thick, each of the p type layers 18(1)-18(2) is about 500 angstroms thick, and each of the intrinsic layers 20(1)-20(4) is about 5000 angstroms thick, although these thicknesses can vary based on the particular application.

In this particular embodiment, conventional photolithography is used to etch the cone-shaped holes 22(1) and 22(2) into the structure 14 through all of the n type layers 16(1)-16(3), p type layers 18(1)-18(2), and intrinsic layers 20(1)-20(4) to the substrate 12, although other numbers, shapes and configurations can be used for the holes 22(1) and 22(2) and the holes 22(1) and 22(2) can extend through other numbers of layers in the structure 14. The region 30(1) adjacent the inner surface of the hole 22(1) is doped to form an n+ region and the region 30(2) adjacent the inner surface of the other hole 22(2) is doped to form a p+ region, although the regions 30(1) and 30(2) around the inner surface of each of the holes 22(1) and 22(2) can have other configurations and can be doped in different manners.

A conductive material is deposited on the surface 28 of the n type layer 16 and on the inner surfaces of the holes 22(1) and 22(2) and portions of the conductive material on the surface 28 of the n type layer 16 are etched away to form the conductive contacts 24(1) and 24(2), although other numbers and types of conductive contacts and other manners for forming the conductive contacts can be used. In this particular embodiment, ordinary metallizations are used for form the conductive contacts 24(1) and 24(2). A load 32 can be coupled to each of the conductive contacts 24(1) and 24(2) and to ground, although the load 32 can be coupled in other manners.

The alpha particle emitter 26 deposited on a portion of the surface 28 of the n type layer 16(1) of the structure 14 and on an inside surface of the conductive contacts 24(1) and 24(2) in the holes 22(1) and 22(2), although the alpha particle emitter 26 can be deposited in other manners and configurations and other types of radio isotope emitters, such as a beta particle emitter can be used. In this particular embodiment, the alpha particle emitting isotopes for the alpha particle emitter 26 are electrochemically deposited, although other manners for forming the alpha particle emitter 26 or other radio isotope emitter can be used, such as by physically placing the alpha particle emitter 26 on the structure 14.

The operation of the battery 10 in accordance with embodiments of the present invention will now be described with reference to FIG. 1. Alpha particles are emitted from the alpha particle emitter 26 into the structure 14, although other types of radio isotopes could be emitted, such as beta particles. As the alpha particles from the alpha particle emitter penetrate into the "p-i-n" junctions formed by each of the p type layers 18(1)-18(2) separated from each of the n type layers 16(1)-16(3) by one of the intrinsic layers 20(1)-20(4), they decelerate and give up their energy by creating electron-hole pairs in the structure 14. These electron-hole pairs at each of the "p-i-n" junctions formed by each of the p type layers 18(1)-18(2) separated from each of the n type layers 16(1)-16(3) by one of the intrinsic layers 20(1)-20(4) are converted into useful electricity much like a solar cell.

The electron and holes are collected in the spatially separated n type layers 16(1)-16(3) and p type layers 18(1)-18(2) of the structure 12 and are transported in a parallel direction to the conductive contacts 24(1) and 24(2). The n+ region 30(1) and the p+ region 30(2) provide a lateral field or extraction voltage within the collection layers. As a result, charge separation and transport occur within two separate orthogonal planes so that there is a reduction in the overlap of the electron and hole wave functions and hence longer recombination lifetimes. The battery 10 is not diffusion limited, but instead is drift dominated. Therefore, the battery 10 has a high radiation tolerance because of the "p-i-n" junctions formed by each of the p type layers 18(1)-18(2) separated from each of the n type layers 16(1)-16(3) by one of the intrinsic layers 20(1)-20(4), but still recovers energy from the alpha particle radiation from the alpha particle emitter 26 or the energy from other types of emitted radio isotopes. This generated electricity or power is transferred to a load 32 which is coupled to the conductive contacts 24(1) and 24(2) and is also coupled to ground.

Accordingly, the present invention provides a radio isotope battery whose performance does not degrade in a matter of hours because of damage to the semiconductor material from the alpha particles. Additionally, the present invention provides a radio isotope battery that can be made extremely small and thus is well suited for emerging micro and nano applications and technologies, such as MEMS. Further, the present invention is very suitable for integration directly on a semiconductor device for a "battery-on-a-chip" concept. The present invention also can be combined in parallel and series combinations to address a wide variety of higher current, voltage, and power requirements.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed:

1. A power source comprising:

a structure comprising two or more elements coupled in series, each of the elements comprising an n type layer on an intrinsic layer on a p type layer, on another intrinsic layer;

at least one source of radiation is disposed on at least a portion of the structure;

at least two openings extending at least partially into the structure; and a conductive contact disposed on the inner surface of each of the openings.

2. The power source as set forth in claim 1 wherein the at least one source of radiation is at least one of an alpha particle emitter and a beta particle emitter.

3. The power source as set forth in claim 1 wherein the at least two openings each extend substantially through the structure.

4. The power source as set forth in claim 1 wherein a region adjacent substantially all of an inner surface of one of the openings comprises an n type region and another region adjacent substantially all of an inner surface of another one of the openings comprises a p type region.

5. The power source as set forth in claim 1 further comprising a substrate supporting the structure.

6. The power source as set forth in claim 1 wherein the two or more elements coupled in series are continuously stacked on top of each other.

7. The power source as set forth in claim 1 wherein the at least one source of radiation is disposed on at least one of the conductive contacts in at least one of the two openings extending at least partially into the structure.

8. A method of making a power source the method comprising:

forming a structure comprising two or more elements coupled in series, each of the elements comprising an n type layer on an intrinsic layer on a p type layer, on another intrinsic layer;

forming at least two openings that each extend at least partially into the structure;

forming a conductive contact on the inner surface of each of the openings; and disposing at least one source of radiation on a portion of the structure.

9. The method as set forth in claim 8 wherein the at least one source of radiation is at least one of an alpha particle emitter and a beta particle emitter.

10. The method as set forth in claim 8 wherein the forming at least two openings further comprises forming the at least two openings to extend substantially through the structure.

11. The method as set forth in claim 8 further comprising doping a region in the elements adjacent substantially all of an inner surface of one of the openings to comprise an n type region and doping another region in the elements adjacent substantially all of an inner surface of another one of the openings to comprise a p type region.

12. The method as set forth in claim 8 further comprising providing a substrate that supports the structure.

13. The method as set forth in claim 8 wherein the forming the structure comprising two or more elements coupled in series further comprises continuously stacking the two or more elements on top of each other.

14. The method as set forth in claim 8 wherein the disposing at least one source of radiation further comprise disposing the at least one source of on at least one of the conductive contacts in at least one of the two openings extending at least partially into the structure.

15. A method of generating power, the method comprising:

providing at least one source of radiation that emits radiation on at least of a portion structure comprising two or more elements coupled in series, each of the elements comprising an n type layer on an intrinsic layer on a p type layer, on another intrinsic layer, wherein the structure further comprises at least two openings extending at least partially into the structure and a first conductive contact disposed on the inner surface of each of the openings; and converting the emitted radiation in the structure to power.

16. The method as set forth in claim 15 wherein the emitted radiation comprises at least one of alpha particles and beta particles.

17. The method as set forth in claim 15 wherein the at least two openings each extend substantially through the structure.

18. The method as set forth in claim 15 further providing a region doped in the elements adjacent substantially all of an inner surface of one of the openings that comprises an n type region and another region doped in the elements adjacent substantially all of an inner surface of another one of the openings comprises a p type region.

19. The method as set forth in claim 15 wherein the structure further comprises a substrate supporting the structure.

20. The method as set forth in claim 15 wherein the emitting further comprises emitting the radiation into the structure comprising the two or more elements which are continuously stacked on top of each other.

21. The method as set forth in claim 15 wherein the providing at least one source of radiation further comprises disposing the at least one source of radiation on at least one of the first conductive contacts in at least one of the two openings extending at least partially into the structure.

* * * * *